(12) United States Patent
Dao

(10) Patent No.: US 11,962,303 B1
(45) Date of Patent: Apr. 16, 2024

(54) HIGH-PERFORMANCE FLIP-FLOPS HAVING LOW CLOCK LOAD AND EMBEDDED LEVEL SHIFTING

(71) Applicant: Steve Dao, Houston, TX (US)

(72) Inventor: Steve Dao, Houston, TX (US)

(73) Assignee: Steve Dao, Houston, TX (US)

( * ) Notice: Subject to any disclaimer, the term of this patent is extended or adjusted under 35 U.S.C. 154(b) by 0 days.

(21) Appl. No.: 18/148,144

(22) Filed: Dec. 29, 2022

(51) Int. Cl.
  *H03K 3/356* (2006.01)
  *H03K 3/3562* (2006.01)
  *H03K 19/0185* (2006.01)

(52) U.S. Cl.
  CPC ........ *H03K 3/35625* (2013.01); *H03K 3/356* (2013.01); *H03K 3/356095* (2013.01); *H03K 19/018521* (2013.01); *H03K 19/01855* (2013.01)

(58) Field of Classification Search
  CPC ........ H03K 3/02; H03K 3/023; H03K 3/0233; H03K 3/02332; H03K 3/353; H03K 3/356; H03K 3/356107; H03K 3/356026; H03K 3/356034; H03K 3/356043; H03K 3/356086; H03K 3/356095; H03K 3/356104; H03K 3/356113; H03K 3/356121; H03K 3/35613; H03K 3/356139; H03K 3/3562; H03K 3/35625; H03K 19/0175; H03K 19/0185; H03K 19/018507; H03K 19/108514; H03K 19/018521
  See application file for complete search history.

(56) References Cited

U.S. PATENT DOCUMENTS

| 9,680,450 B2 | 6/2017 | Bailey |
| 10,340,900 B2 | 7/2019 | Barn et al. |
| 2006/0145743 A1* | 7/2006 | Neubauer ................ H03K 3/00 327/203 |

\* cited by examiner

*Primary Examiner* — Long Nguyen

(74) *Attorney, Agent, or Firm* — Norton Rose Fulbright US LLP

(57) ABSTRACT

An architecture for high-performance flip-flops having minimal clock-activated transistors is disclosed. The flip-flops operating in a first voltage domain can receive an input signal from a second voltage domain. The flip-flops include a first latch electrically coupled to a second latch. The first latch includes a first output and a second output. The second latch further includes a first and a second keeper pull-up sub-circuit which electrically couples to the first and second output of the first latch. The clock-gating functionality of the first and second keeper pull-up sub-circuits is merged with the first latch to reduce the loading on the clock signal, and thus the operation of the flip-flop is contention-free and fully-static. An embodiment of the second latch includes only one clock-activated transistor for low-power application. Another embodiment includes two clock-activated transistors for high-speed application. The high-performance flip-flops have near-zero setup time and a two-stage propagation delay.

19 Claims, 8 Drawing Sheets

HIGH-PERFORMANCE FLIP-FLOPS HAVING LOW CLOCK LOAD AND EMBEDDED LEVEL SHIFTING

FIELD OF THE DISCLOSURE

The invention described herein generally pertain to the field of flip-flop circuits, and more particularly, to flip-flop devices with high-performance and low power consumption, low latency, and low setup-time characteristics, and to the manner of making and using the same or components thereof.

BACKGROUND

High-performance systems like microprocessors may use high clock frequencies to improve throughput by employing deep pipelining techniques, as a deep pipeline allows each logic stage to be clocked at a higher frequency. Such high clock frequencies may benefit from dynamic-like circuit topologies using precharge devices. These precharge circuits may burden the clock network with increased transistor loads and lead to greater power consumption. Further exacerbating the clock loading issue is the use of fully-static circuits which may use clock-gated keeper sub-circuits to avoid drive contention between pull-up and pull-down networks. Contention-free circuits tend to avoid ratioed logic and become less vulnerable to process variations. On the other hand, static circuits avoid dynamic storage nodes which are susceptible to noise-induced failures. The activity factor (the duration that an input signal toggles each clock cycle) of a digital circuit is approximately 5-15%, while circuits with precharge devices tend to toggle every cycle (100% activity factor) even when input is constant. Thus, a large portion of a digital system's power (up to 50%) is consumed by the clock network as dynamic power dissipation. With the present demand of mobile devices requiring a smaller physical footprint and smaller battery sizes, a digital system's power consumption can become the limiting factor in modern VLSI (Very Large Scale Integrated) designs. Thus, the demand of a high-performance circuit is at odds with the demand of low-power mobile devices.

A flip-flop is a memory element generally used in pipelined microprocessors to hold intermediate results of logic stages. The flip-flop, also known as edge-triggered flip-flop, captures and launches the data based on transitions of a clock signal and otherwise retains the state of the captured data bit in an internal storage node. The flip-flop generally comprises of a first "master" latch electrically coupled to a second "slave" latch. The master latch can be transparent when clock signal is at first level (low) and samples the main input signal. The master latch can be opaque when clock signal is at second level (high) and blocks any changes in the main input signal from propagating to the slave latch. The output of the master latch is the input to the slave latch. The slave latch can be active when the clock signal transitions to second level and can generate an output signal depending on the level of the sampled main input signal from the master latch. The slave latch can store the sampled main input signal onto an internal storage node and can maintain a stable output signal when the clock signal is at first level.

A popular technique to reduce power consumption in digital VLSI systems is to partition the design into multiple voltage domains. Critical computation intensive circuits with sensitive timing paths may operate at a higher supply voltage while the remaining circuits operate at a lower supply voltage. Thus, the input signal may originate in a different voltage domain than the voltage domain of the flip-flop, thereby a voltage level mismatch at the input of the flip-flop can occur. To address this mismatch, a separate level converter circuit can be used to generate an equivalent signal in the same voltage domain as the flip-flop.

Highly pipelined microprocessors use flip-flops in each pipeline stage to divide the processing logic for higher performance gains; therefore, the flip-flop should have a low latency to improve throughput. If the latency consumes a large portion of the timing budget, the effects of pipelining to increase throughput is diminished. Two chief components affecting the latency are the setup time and clk-Q propagation delay. A low-latency flip-flop should have minimal setup time and minimal clk-Q propagation delay. Setup time is the time the data input signal must be stable prior to the rising edge of the clock signal. Often, high-performance flip-flops such as sense-amplifier based flip-flops, employ a precharge sub-circuit to attain a near-zero setup time at the expense of increased propagation delay. These sense-amplifier based flip-flops may have three or more stage delays for the propagation delay due to the slave latch.

SUMMARY

The disclosure presents a flip-flop architecture which can receive an input signal from an independent voltage domain without the need for additional level shifting circuitry. This disclosure presents a flip-flop architecture with only two stage delays for the propagation delay. The slave latch may be configured to have one or two transistors electrically coupled to the clock network to minimize clock power while maintaining a contention-free operation. The reduced loading on the clock network is achieved by sharing clock-coupled transistors with common functionality.

According to one embodiment, a flip-flip circuit may comprise a first latch and a second latch. The first latch may comprise four clock-activated transistors, a first output node, and a second output node. The second latch may operate in a first voltage domain and comprise a first keeper pull-up sub-circuit coupled to the first output node, wherein the first keeper pull-up sub-circuit is electrically coupled to a first-clock-activated transistor of the first latch and the first clock-activated transistor is a clock-gated device for the first keeper pull-up sub-circuit; a second keeper pull-up sub-circuit coupled to the second output node, wherein the second keeper pull-up sub-circuit is electrically coupled to a second clock-activated transistor of the first latch and the second clock-activated transistor is a clock-gated device for the second keeper pull-up sub-circuit; a first pull-down network; a second pull-down network; and wherein the second latch is configured to merge pull-up functionality of the first keeper pull-up sub-circuit with the first clock-activated transistor of the first latch and to merge pull-up functionality of the second keeper pull-up sub-circuit with the second clock-activated transistor of the first latch.

In certain embodiments, the first pull-down network of the second latch receives a first input from the second output node and the second pull-down network of the second latch receives a second input from the first output node.

In another embodiment, the first clock-activated transistor and a third clock-activated transistor of the first latch are electrically coupled to the first output node and the second clock-activated transistor and a fourth clock-activated transistor of the first latch are electrically coupled to the second output node. The first latch may further comprise a first p-type transistor electrically coupled to a first intermediate node of the first latch to form a first inverter sub-circuit and the first intermediate node is an output of the first inverter sub-circuit. The first latch may further comprise a second p-type transistor electrically coupled to a second intermediate node of the first latch to form a second inverter sub-circuit and the second intermediate node is an output of the second inverter sub-circuit.

In some embodiments, the first pull-down network is electrically coupled to the second pull-down network and the first pull-down network and the second pull-down network are electrically coupled to a first clock-activated transistor of the second latch. According to certain embodiments, this first clock-activated transistor of the second latch is the only clock-activated transistor of the second latch.

In some embodiments, the first pull-down network receives an input signal from a second voltage domain independent from the first voltage domain and the second pull-down network receives an inverted input signal from the second voltage domain.

In some embodiments, the first pull-down network comprises a second clock-activated transistor of the second latch and the second pull-down network comprises a third clock-activated transistor of the second latch, wherein the first pull-down network is electrically decoupled from the second pull-down network.

In another embodiment, the second latch further comprises a first keeper pull-down sub-circuit electrically coupled to the first pull-down network, wherein the first keeper pull-down sub-circuit and the first pull-down network are electrically coupled to a first intermediate node of the first latch. The first keeper pull-down sub-circuit and the first pull-down network are electrically coupled to a second keeper transistor of the first latch, wherein the second keeper transistor is enabled by the first pull-down network. In certain embodiments, the second pull-down network is electrically coupled to a second intermediate node of the first latch. In certain embodiments, the second pull-down network is electrically coupled further to a first keeper transistor of the first latch, wherein the first keeper transistor is enabled by the second pull-down network.

In some embodiments, the flip-flop circuit is configured to sample a data bit when an input signal from the second voltage domain transitions before the rising edge of the clock signal or at the rising edge of the clock.

In another embodiment, the first latch further comprises a level restoring sub-circuit electrically coupled to the first clock-activated transistor and the second clock-activated transistor and coupled to a first output node and a second output node of the first latch.

In another embodiment, the propagation delay of the flip-flop circuit is one or two stage delays.

According to another embodiment, the flip-flop circuit may include: a first latch operating in a first voltage domain, wherein the first latch comprises: four clock-activated transistors, a first output node, a second output node, a first intermediate node, a second intermediate node, a first p-type transistor electrically coupled to the first intermediate node to form a first inverter sub-circuit, and a second p-type transistor electrically coupled to the second intermediate node to form a second inverter sub-circuit; a second latch operating in the first voltage domain, wherein the second latch comprises: a first keeper pull-up sub-circuit coupled to the second intermediate node; a second keeper pull-up sub-circuit; a first keeper pull-down sub-circuit coupled to the first intermediate node; a first pull-down network; and a second pull-down network, wherein the first intermediate node is an output of the first inverter sub-circuit and the second intermediate node is an output of the second inverter sub-circuit.

In certain embodiments, the first keeper pull-up sub-circuit is coupled to the output of the second inverter sub-circuit, wherein the first pull-down network is driven by the output of the second inverter sub-circuit and the first pull-down network is activated upon the discharging of the first output node of the first latch.

In certain embodiments, the first pull-down network is activated, the first keeper pull-up sub-circuit is deactivated.

In some embodiments, the second keeper pull-up sub-circuit is coupled to the second output node of the first latch.

In some embodiments, the second keeper pull-up sub-circuit is coupled to the output of the first inverter sub-circuit and the second pull-down network receives an input from the first output node of the first latch.

As used herein, the term "coupled" means connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially parallel includes parallel), as understood by a person of ordinary skill in the art.

The phrase "and/or" means "and" or "or". To illustrate, A, B, and/or C includes: A alone, B alone, C alone, a combination of A and B, a combination of A and C, a combination of B and C, or a combination of A, B, and C. In other words, "and/or" operates as an inclusive or.

Further, a device or system that is configured in a certain way is configured in at least that way, but it can also be configured in other ways than those specifically described.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements, but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

Figure 1:
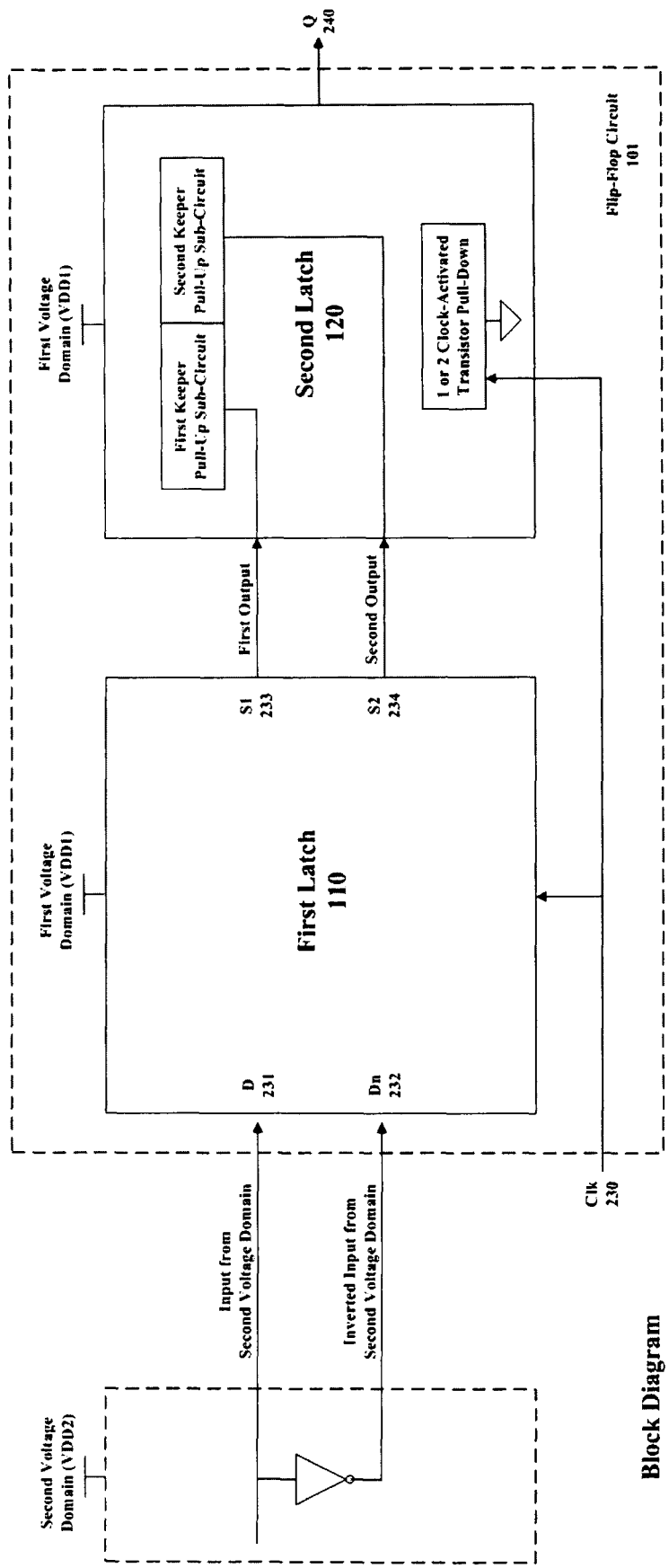
FIG. 1 is a block diagram of a flip-flop circuit according to some embodiments of the disclosure.

Elements and acts in the figures are illustrated for simplicity and have not necessarily been rendered according to any particular sequence or embodiment.

DETAILED DESCRIPTION

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

Metal-Oxide Semiconductor Field-Effect Transistor (MOSFET) describes a type of transconductive device that may be used in modern Very Large Scale Integrated (VLSI) systems. MOSFETs are designed as one of two basic types, n-channel and p-channel. N-channel MOSFETs open a conductive path between the source and drain when a positive voltage greater than the device's threshold voltage (V T) is applied from the gate to the source. P-channel MOSFETs open a conductive path when a voltage greater than the device's threshold voltage is applied from the source to the gate. Complimentary MOSFET (CMOS) describes a circuit designed with a mix of n-channel and p-channel MOSFETs. In CMOS designs, n-channel and p-channel may be arranged such that a second or third level on the gate of a MOSFET turns a n-channel device on (opens a conductive path), and turns a p-channel MOSFET off (closes conductive path). Conversely, a first level on the gate of a MOSFET turns a p-channel on and a n-channel off. While planar CMOS logic is used in the examples, it is noted that any suitable digital logic processes including FinFETs, GAA (Gate-All-Arround), or 3D vertical transistors may be used for the circuits described in this disclosure. Furthermore, all drawings depict n-channel and p-channel MOSFETs as three terminal devices comprising of drain, gate, and source unless stated otherwise. The fourth terminal being the body substrate is assumed to be coupled to low-power supply for n-channel and high-power supply for p-channel unless stated otherwise.

Low power integrated circuits often are partitioned into multiple voltage domains as a means to manage power consumption. High performance and critical timing tasks are generally implemented with circuits operating in a higher voltage domain while the remaining circuits operate in a lower voltage domain. When a circuit from a first voltage domain communicates with a circuit in a second voltage domain, a level converter or level shifter can be used to translate the voltage level from first voltage domain to a suitable voltage level to be received by the circuit from the second voltage domain. For low power designs, it is desirable to incorporate this level shifting circuitry into a flip-flop.

It should be noted that the term "first level" generally refers to a voltage level at low-power supply or ground. The term "second level" generally refers to a voltage level at first high-power supply (VDD1) and is associated with the first voltage domain of the flip-flop. The term "third level" generally refers to a voltage level at second high-power supply (VDD2) and is associated with the second voltage domain where the input signal originates. The third level can be same or different than the second level and, if different, can be a voltage level greater or less than the second level.

FIG. 1 shows a flip-flop circuit 101 which receives an input signal originating from a different voltage domain. The flip-flop circuit 101 operates in a first voltage domain, VDD1, and receives a pair of input signals D 231 and Dn 232 originating from second voltage domain, VDD2. D 231 is the main input signal whereas Dn 232 is the inverted main signal. Hence, flip-flop circuit 101 latches a state of the input signal that originates from a different voltage domain than itself. The second voltage domain, VDD2, may be of a lower voltage level than the first voltage domain, VDD1. However, the second voltage domain can be either different or same voltage level as the first voltage domain, VDD1, for proper circuit functionality. Main input signal D 231 and inverted main input signal Dn 232 transition between first level (e.g., low-power supply) and third level.

Figure 2:
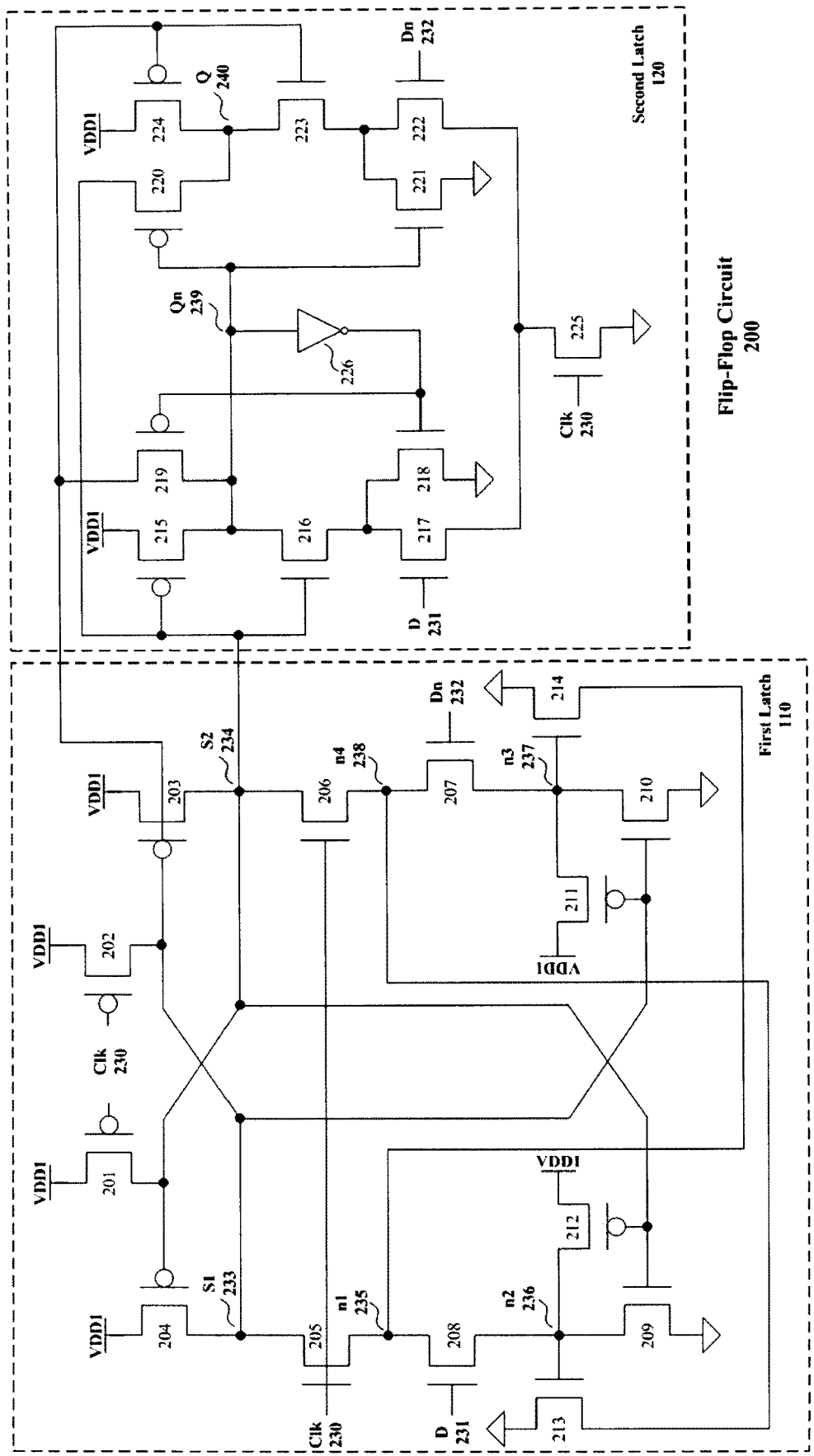
FIG. 2 is a flip-flop circuit diagram with one clock element in the second latch stage according to some embodiments of the disclosure.

FIG. 1 also shows a block diagram of the flip-flop invention of FIG. 2. The flip-flop circuit 101 includes a first latch 110 electrically coupled to a second latch 120. FIG. 1 includes the principal connectivity between the first latch 110 and second latch 120 and illustrates the shared nodes between the first latch 110 and second latch 120. Flip-flop 101 has the following I/O terminals: an input, an inverted input, a clock, and an output. The inputs to both first and second latches are main input signal D 231, inverted main input signal Dn 232, and clock signal Clk 230. In some embodiments, the main input signal D 231 and inverted main input signal Dn 232 are not electrically coupled to the second latch 120. The outputs of the first latch 110 are first output node S1 233 and second output node S2 234. The second latch 120 includes a first keeper pull-up sub-circuit and a second keeper pull-up sub-circuit. Furthermore, some embodiments include one clock-activated transistor in the pull-down network of second latch 120 while other embodiments include two clock-activated transistors. The first output node S1 233 is electrically coupled to the first keeper pull-up sub-circuit, and the second output node S2 234 is electrically coupled to the second keeper pull-up sub-circuit. The output of second latch 120 is also the output signal Q 240. Both first and second latches operate within the first voltage domain, VDD1.

Referring to FIG. 2, the flip-flop circuit 200 comprises of a first latch 110 and a second latch 120. First latch 110 comprises transistors 201 to 214. The sub-units of first latch 110 include a first inverter sub-circuit, a second inverter sub-circuit, and precharge transistors. The first inverter sub-circuit comprises transistors 212 and 209, and the second inverter sub-circuit comprises transistors 211 and 210. The first and second inverter sub-circuit reuses transistors 209 and 210 for each's respective pull-down network without separate discrete transistors. Transistor 209 serves as the foot transistor of the pull-down stack associated with main input signal D 231 while transistor 210 serves as the foot transistor of the pull-down stack associated with inverted main input signal Dn 232. Transistor 212, also known as the first p-type transistor, is electrically coupled to transistor 209 at the first intermediate node n2 236 to form the first inverter sub-circuit. Likewise, transistor 211, also known as the second p-type transistor, is electrically coupled to transistor 210 at the second intermediate node n3 237 to form the second inverter sub-circuit. The precharge transistors include transistors 201 and 202. First latch 110 further includes a first output node S1 233 and a second output node S2 234.

The remaining connectivity of first latch 110 according to certain embodiments is described. For the pull-down stack associated with main input signal D 231, the drain terminal of transistor 205 is coupled to the first output node S1 233, and the source terminal is coupled to node n1 235. The drain terminal of transistor 208 is coupled to node n1 235, and the source terminal is coupled to first intermediate node n2 236. The drain terminal of transistor 209 is coupled to first intermediate node n2 236, and the source terminal is coupled to low-power supply. The drain terminal of first p-type transistor 212 is coupled to first intermediate node n2 236, and the source terminal is coupled to first domain high-power supply VDD1. The drain terminal of transistor 213 is coupled to node n4 238, and the source terminal is coupled to low-power supply. The gate terminal of transistor 213 is coupled also to first intermediate node n2 236. The gate terminals of transistors 212 and 209 are coupled to second output node S2 234. The gate terminal of transistor 208 is coupled to main input signal D 231, and the gate terminal of transistor 205 is coupled to clock signal Clk 230. For the pull-down stack associated with inverted main input signal Dn 232, the drain terminal of transistor 206 is coupled to the second output node S2 234, and the source terminal is coupled to node n4 238. The drain terminal of transistor 207 is coupled to node n4 238, and the source terminal is coupled to second intermediate node n3 237. The drain terminal of transistor 210 is coupled to the second intermediate node n3 237, and the source terminal is coupled to low-power supply. The drain terminal of second p-type transistor 211 is coupled to second intermediate node n3 237, and the source terminal is coupled to first domain high-power supply VDD1. The drain terminal of transistor 214 is coupled to node n1 235, and the source terminal is coupled to low-power supply. The gate terminal of transistor 214 is coupled also to second intermediate node n3 237. The gate terminals of transistors 211 and 210 are coupled to first output node S1 233. The gate terminal of transistor 207 is coupled to inverted main input signal Dn 232, and the gate terminal of transistor 206 is coupled to clock signal Clk 230. The drain terminal of precharge transistor 201 is coupled to second output S2 234, and the drain terminal of precharge transistor 202 is coupled to first output S1 233. The gate terminals of precharge transistors 201 and 202 are coupled to clock signal Clk 230, and the source terminals are coupled to first domain high-power supply VDD1. It should be noted that the first output node S1 233 is coupled to two clock-activated transistors 202 and 205. Likewise, the second output node S2 234 is coupled to two clock-activated transistors 201 and 206. The drain terminal of transistor 204 is coupled to first output S1 233, and the source terminal is coupled to first domain high-power supply VDD1. The drain terminal of transistor 203 is coupled to second output S2 234, and the source terminal is coupled to first domain high-power supply VDD1. The gate terminal of transistor 204 is coupled to second output S2 234, and the gate terminal of transistor 203 is coupled to first output S1 233.

Second latch 120 comprises transistors 215-225 and inverter 226. The sub-units of second latch 120 include a first pull-down network, a second pull-down network, a first keeper pull-up sub-circuit, and a second keeper pull-up sub-circuit. The first pull-down network comprises transistors 216 and 217 while the second pull-down network comprises transistors 223 and 222. The first keeper pull-up sub-circuit comprises transistors 219 and 202. It should be noted that precharge transistor 202 also serves as a clock-gated device for the first keeper pull-up sub-circuit. The second keeper pull-up sub-circuit comprises transistors 220 and 201. Likewise, precharge transistor 201 also serves as a clock-gated device for the second keeper pull-up sub-circuit. Hence, second latch 120 merges the pull-up functionality of the first and second keeper pull-up sub-circuits with the precharge transistors from first latch 110 by reusing clock-activated transistors with common functionality to reduce the burden on the clock signal. The gate terminal of transistor 216 is coupled to the second output node S2 234, and the gate terminal of transistor 223 is coupled to the first output node S1 233. Furthermore, the gate terminal of transistor 217 is coupled to main input signal D 231, and the gate terminal of transistor 222 is coupled to inverted main input signal Dn 232. Consequently, the first pull-down network receives a first input from the second output node S2 234 and receives a third input from the main input signal D 231. The second pull-down network receives a second input from the first output node S1 233 and receives a fourth input from the inverted main input signal Dn 232.

The remaining connectivity of second latch 120 according to some embodiments is described. The drain terminal of transistor 215 is coupled to storage node Qn 239, and the source terminal is coupled to first domain high-power supply VDD1. The drain terminal of transistor 216 is coupled also to storage node Qn 239, and the source terminal is coupled to the drain terminal of transistor 217. The source terminals of transistors 217 and 222 are coupled to the drain terminal of transistor 225. In this manner, the first pull-down network is coupled to the second pull-down network, and both first and second pull-down networks are coupled to first clock-activated transistor 225. The gate terminals of transistors 215 and 216 are coupled to the second output node S2 234. The drain terminal of transistor 224 is coupled to output signal Q 240, and the source terminal is coupled to first domain high-power supply VDD1. The drain terminal of transistor 223 is coupled also to output signal Q 240, and the source terminal is coupled to the drain terminal of transistor 222. The gate terminals of transistors 224 and 223 are coupled to the first output node S1 233. The gate terminal of first clock-activated transistor 225 is coupled to clock signal Clk 230, and the source terminal is coupled to low-power supply. For the first keeper pull-up sub-circuit, the source terminal of transistor 219 is coupled to the first output node S1 233, and the drain terminal is coupled to storage node Qn 239. The drain terminal of transistor 218 is coupled to the drain terminal of transistor 217, and the source terminal is coupled to low-power supply. The gate terminals of transistors 219 and 218 are coupled to the output of inverter 226 whose input is coupled to storage node Qn 239. For the second keeper pull-up sub-circuit, the source terminal of transistor 220 is coupled to second output node S2 234, and the drain terminal is coupled to output signal Q 240. The drain terminal of transistor 221 is coupled to the drain terminal of transistor 222, and the source terminal is coupled to low-power supply. The gate terminals of transistors 220 and 221 are coupled to the storage node Qn 239.

The operation of the flip-flop circuit 200 according to some embodiments is now described. In the embodiment of FIG. 2, the flip-flop circuit 200 receives a main input signal D 231 and a clock signal Clk 230 and generates an output signal Q 240. When clock signal Clk 230 is at first level (low-power supply), first output node S1 233 and second output node S2 234 are charged to second level (high VDD1) by precharge transistors 201 and 202. First intermediate node n2 236 and second intermediate node n3 237 are discharged to first level by transistors 209 and 210. Transistors 203 and 204 are deactivated during clock signal Clk 230 at first level. When main input signal D 231 is at third level as clock signal Clk 230 transitions from first level to second level, transistors 205 and 208 are activated and the first output node S1 233 is discharged to first level. Transistor 210 is deactivated to prevent second output node S2 234 from discharging, thereby blocking changes in the main input signal D 231 from propagating to the second latch 120. The second output node S2 234 remains at second level held by transistor 203 activated upon the discharging of the first output node S1 233 to first level. Transistor 224 is activated to charge output signal Q 240 to second level, thereby completing the capture and latching of input data bit at second level. As second output node S2 234 remains at second level, transistors 216 and 217 of the first pull-down network are activated and discharges storage node Qn 239 via first clock-activated transistor 225. It should be noted that the storage node Qn 239 maintains the inverse polarity of output signal Q 240. While clock signal Clk 230 remains at second level and should main input signal D 231 change from third level to first level, an alternative low-impedance path for first output node S1 233 to low-power supply via transistors 205 and 214 is provided to avoid the first output node S1 233 from being in a dynamic floating state. This alternative path is formed when first output node S1 233 discharges to first level to activate second p-type transistor 211 of the second inverter sub-circuit. Second intermediate node n3 237 is charged to second level and activates transistor 214. It should be noted that when flip-flop circuit 200 captures an input data bit at second level during the rising edge of clock signal Clk 230, there is a two stage propagation delay for output signal Q 240 to transition to second level. The first stage delay is governed by three-series stack transistors 205, 208, and 209 discharging first output node S1 233 and activating transistor 224 for the second stage delay.

When clock signal Clk 230 transitions from second level to first level (also known as precharge phase of clock), second latch 120 enters into storage or latching mode to maintain output signal Q 240 at current level. Since first output node S1 233 and second output node S2 234 are precharged to second level, the first and second pull-down networks of the second latch 120 are deactivated. Furthermore, transistors 215 and 224 are deactivated. As storage node Qn 239 (at first level) drives the input of inverter 226, transistor 218 is activated. Transistors 216 and 218 provide a low-impedance path for storage node Qn 239 to low-power supply. As storage node Qn 239 is held at a first level, transistor 220 of the second keeper pull-up sub-circuit is activated along with precharge transistor 201 to hold output signal Q 240 at stable second level. Thus, during precharge phase (e.g. first level) of clock signal Clk 230, the second keeper pull-up sub-circuit maintains the output signal Q 240 at current level. An additional benefit of coupling transistor 220 to second output node S2 234 is that transistor 220 assists in the pull-up effort of output signal Q 240 improve the propagation delay. Should the main input signal D 231 change from third level to first level even when clock signal Clk 230 is at second level, storage node Qn 239 is still held at first level by the same two transistors 216 and 218. It can be observed that transistor 218 essentially bypasses transistor 217 to low-power supply once storage node Qn 239 is discharged to first level.

Now the operation of flip-flop circuit 200 according to certain embodiments is described when main input signal D 231 is at first level as clock signal Clk 230 transitions from first level to second level. Transistors 206 and 207 are activated, and the second output node S2 234 is discharged to first level. Transistor 209 is deactivated to prevent first output node S1 233 from discharging, thereby blocking changes in the main input signal D 231 from propagating to the second latch 120. The first output node S1 233 remains at second level held by transistor 204 activated upon the discharging of the second output node S2 234 to first level. As transistor 224 remains deactivated, transistor 223 already activated prior to the rising edge of clock signal Clk 230 along with activated transistors 222 and 225 discharge output signal Q 240 to first level, thereby completing the capture and latching of input data bit at first level. When second output node S2 234 discharges to first level, transistor 215 is activated and charges storage node Qn 239 to second level. While clock signal Clk 230 remains at second level and should main input signal D 231 change from first level to third level, an alternative low-impedance path for second output node S2 234 to low-power supply via transistors 206 and 213 is provided to avoid the second output node S2 234 from being in a dynamic floating state. This alternative path is formed when second output node S2 234 discharges to first level to activate first p-type transistor 212 of the first inverter sub-circuit. First intermediate node n2 236 is charged to second level and activates transistor 213. When flip-flop circuit 200 captures an input data bit at first level during the rising edge of clock signal Clk 230, there is only one stage propagation delay for output signal Q 240 to transition to first level. The one stage propagation delay is governed by the three-series stack of transistors 223, 222, and 225.

When clock signal Clk 230 transitions from second level to first level, the current level of output signal Q 240 is maintained, and the first and second pull-down networks of second latch 120 are deactivated. Transistors 215 and 224 also are deactivated. As storage node Qn 239 (at second level) drives the input of inverter 226, transistor 219 is activated. Thus, the first keeper pull-up sub-circuit with transistor 219 and precharge transistor 202 maintains storage node Qn 239 at second level and in turn, activates transistor 221. During precharge phase of clock signal Clk 230, transistor 223 remains activated, thereby output signal Q 240 is held at stable first level. It should be noted that the first keeper pull-up sub-circuit is activated to maintain storage node Qn 239 at current level during the precharge phase. Furthermore, should the main input signal D 231 change from first level to third level even when clock signal Clk 230 is at second level, output signal Q 240 still remains at first level due to transistors 223 and 221. Transistor 221 essentially bypasses transistor 222 to low-power supply once storage node Qn 239 is charged to second level.

FIG. 2 reveals the input-gated nature of the first and second pull-down networks in the second latch 120. The first pull-down network is input-gated by the main input signal D 231 while the second pull-down network is input-gated by the inverted main input signal Dn 232. This input-gating technique allows the first pull-down network to be coupled to the second pull-down network and thus, the first clock-activated transistor 225 can be coupled to the source terminals of transistors 217 and 222. Hence, input-gating second latch 120 only requires one clock-activated transistor to be utilized in the embodiment of FIG. 2 in order to reduce the load burden on the clock signal. If the second latch 120 does not employ input-gating technique, then the first and second pull-down networks are separated as shown in the embodiment of FIG. 3.

Figure 3:
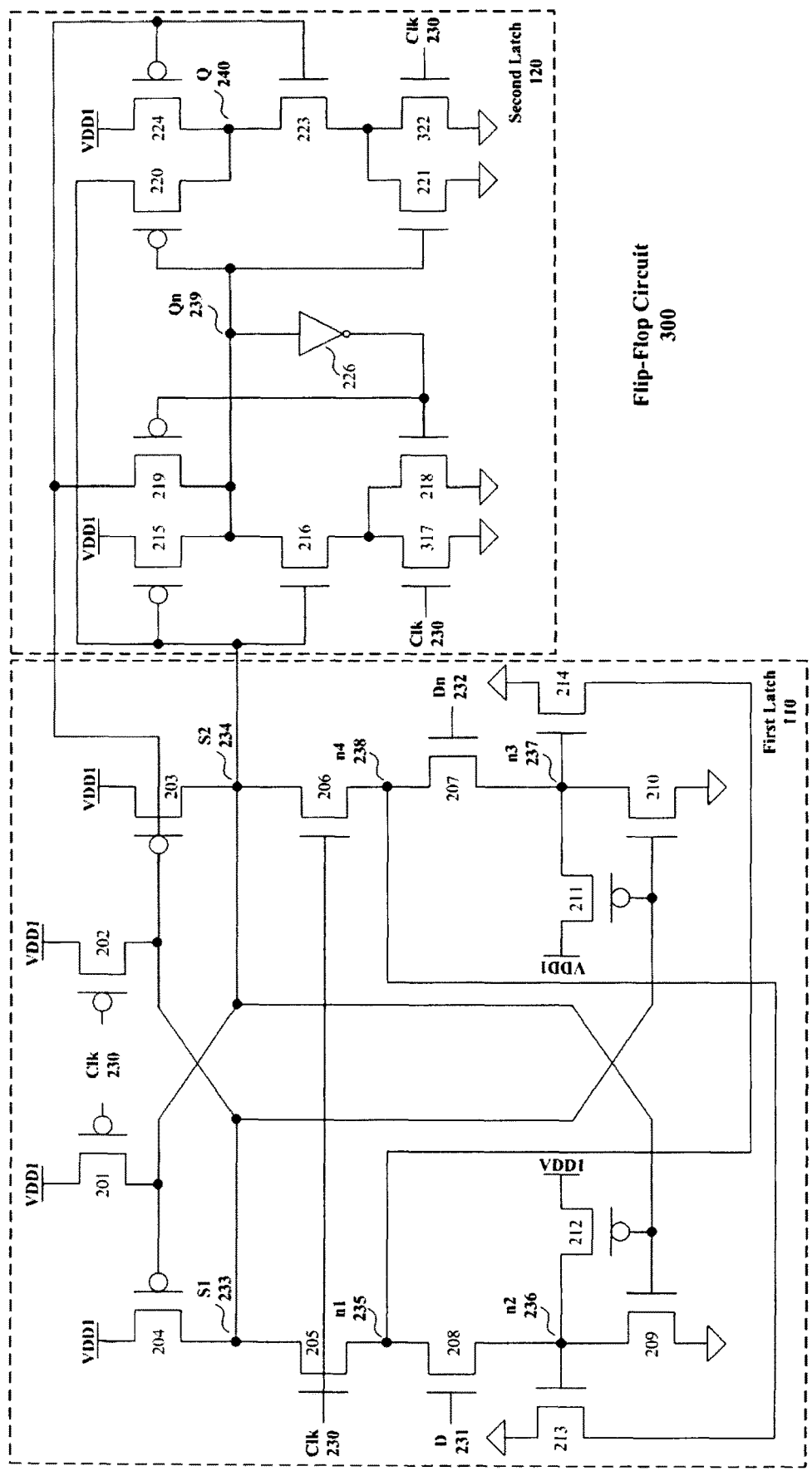
FIG. 3 is a flip-flop circuit diagram with two clock elements in the second latch stage according to some embodiments of the disclosure.

FIG. 3 discloses an embodiment which includes two clock-activated transistors in the second latch 120 wherein the partial components in FIG. 3 and subsequent figures that are the same as or similar to those in FIG. 2 are denoted by the same or similar reference numerals Flip-flop circuit 300 shows the first pull-down network having a second clock activated transistor 317 and the second pull-down network having a third clock-activated transistor 322. The first pull-down network comprises transistors 216 and 317 while the second pull-down network comprises transistors 223 and 322. Flip-flop circuit 300 shares the same functionality and similar operation as flip-flop circuit 200. The embodiment of FIG. 3 may be configured for high-performance operations. The one stage propagation delay for the falling transition of output signal Q 240 now consists of two series-coupled transistors compared to the three series-coupled transistors of FIG. 2. The two stage propagation delay for the rising transition of output signal Q 240 is improved due to the separation of the first and second pull-down networks.

The embodiments of FIGS. 2 and 3 merge the clock-gating functionality of the first and second keeper pull-up sub-circuits with the precharge transistors of first latch 110. The embodiment illustrated in FIG. 4 further reduces total circuit element count by collapsing additional elements with common functionality into a single circuit element. Transistors 216 and 223 from FIGS. 2 and 3 may be eliminated to reduce the complexity and total element count of flip-flop circuit 400 shown in FIG. 4 according to certain embodiments. The first and second p-type transistors 211 and 212 are eliminated from the first latch 110. The first pull-down network of second latch 120 includes only transistor 417 and employs transistor 209 of first latch 110 to complete the pull-down process. The second pull-down network of second latch 120 includes only transistor 422 and employs transistor 210 of first latch 110 to complete the pull-down process. A first keeper pull-down sub-circuit comprising transistor 418 also employs transistor 209 of first latch 110 to maintain storage node Qn 239 at first level during the precharge phase of clock signal Clk 230. It should be noted that second latch 120 in the embodiment of FIG. 4 does not employ input-gating technique and the first pull-down network receives the clock signal Clk 230 as the only input and the second pull-down network receives the clock signal Clk 230 as the only input. The drain terminal of transistor 417 is coupled to the storage node Qn 239, and the gate terminal is coupled to clock signal Clk 230. The drain terminal of transistor 418 is coupled also to the storage node Qn 239, and the gate terminal is coupled to the output of inverter 226. The source terminals of transistors 417 and 418 are coupled to the first intermediate node n2 236 of first latch 110. In this manner, the first keeper pull-down sub-circuit is coupled to the first pull-down network, and the first keeper pull-down sub-circuit and the first pull-down network are coupled also to the first intermediate node n2 236. The drain terminal of transistor 422 is coupled to output signal Q 240, and the gate terminal is coupled to clock signal Clk 230. The source terminal of transistor 422 is coupled to the second intermediate node n3 237. The second pull-down network is coupled to the second intermediate node of the first latch. The drain terminal of transistor 421 is coupled to the output signal Q 240, and the source terminal is coupled to low-power supply. The gate terminal of transistor 421 is coupled to the storage node Qn 239.

The embodiments of FIGS. 2 and 3 employ p-type transistors in the first latch 110 to activate transistors 213 or 214 to provide an alternative low-impedance path for first output node S1 233 or second output node S2 234 to low-power supply, should the main input signal D 231 change while clock signal Clk 230 is at second level. The role of activating first keeper transistor 214 and second keeper transistor 213 belongs to the second pull-down network and first pull-down network, respectively. The source terminal of transistor 422 is coupled also to the gate terminal of first keeper transistor 214. Hence the second pull-down network is coupled to the first keeper transistor 214 which is activated when both output signal Q 240 and clock signal Clk 230 are at second level. For output signal Q 240 to be at second level, first output node S1 233 is discharged and transistor 224 is activated. Activating transistor 422 conducts a voltage level equivalent to (VDD1−$V_T$) to the gate terminal of first keeper transistor 214. Likewise, the source terminal of transistor 417 is coupled to the gate terminal of second keeper transistor 213. Hence the first pull-down network is coupled to the second keeper transistor 213 which is activated when both storage node Qn 239 and clock signal Clk 230 are at second level. In this case, output signal Q 240 is at first level and second output node S2 234 is discharged to activate transistor 215. Activating transistor 417 conducts a voltage level equivalent to (VDD1−$V_T$) to the gate terminal of second keeper transistor 213. In summary, first pull-down network activates second keeper transistor 213 while second pull-down network activates first keeper transistor 214.

Figure 4:
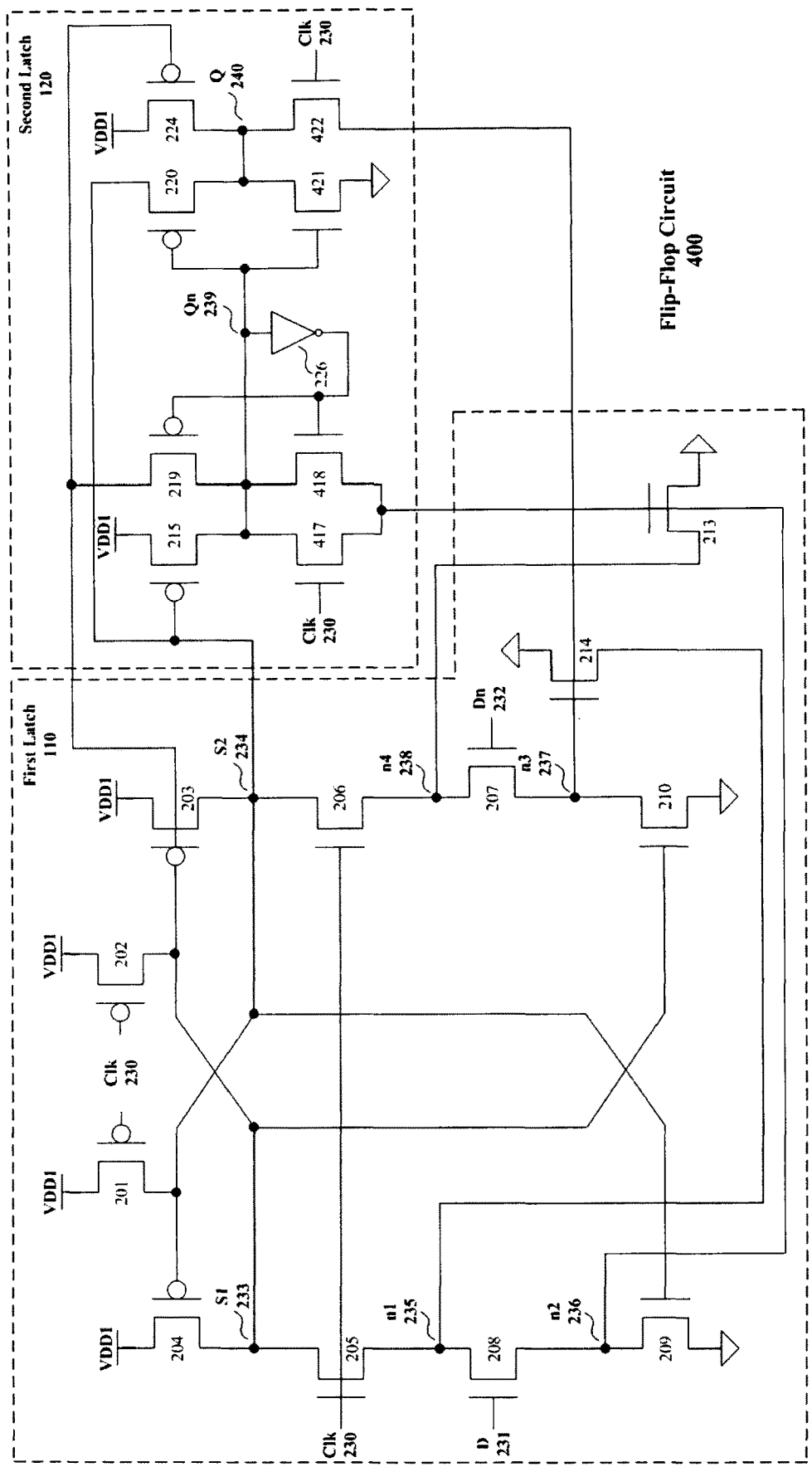
FIG. 4 is a flip-flop circuit diagram with reduced element count according to some embodiments of the disclosure.

The operation of the embodiment of FIG. 4 is similar to the embodiments from FIGS. 2 and 3. Only the pull-down networks associated with the second latch 120 will be described. If first output node S1 233 discharges upon the rising edge of clock signal Clk 230, output signal Q 240 is charged to second level, and second pull-down network (transistor 422) activates first keeper transistor 214 to provide first output node S1 233 with an alternative path to low-power supply. Transistor 210 is deactivated to prevent a short circuit at output signal Q 240. First pull-down network (transistor 417) is activated along with transistor 209 to discharge storage node Qn 239 to first level. Second keeper transistor 213 is deactivated. Furthermore, first keeper pull-down sub-circuit (transistor 418) is activated along with transistor 209 to maintain storage node Qn 239 at first level during the precharge phase of clock signal Clk 230. If second output node S2 234 discharges upon the rising edge of clock signal Clk 230, output signal Q 240 discharges to first level via transistors 422 and 210. First keeper transistor 214 is deactivated. Storage node Qn 239 is charged to second level by transistor 215. First pull-down network (transistor 417) activates second keeper transistor 213 to provide second output node S2 234 with an alternative path to low-power supply. Deactivated transistor 209 disables storage node Qn 239 from low-power supply. First keeper pull-down sub-circuit (transistor 418) is deactivated; however, first keeper pull-up sub-circuit (transistor 219) and precharge transistor 202 maintain storage node Qn 239 at second level during the precharge phase of clock signal Clk 230. Furthermore, transistor 421 is activated to maintain output signal Q 240 at first level during the precharge phase.

Figure 5:
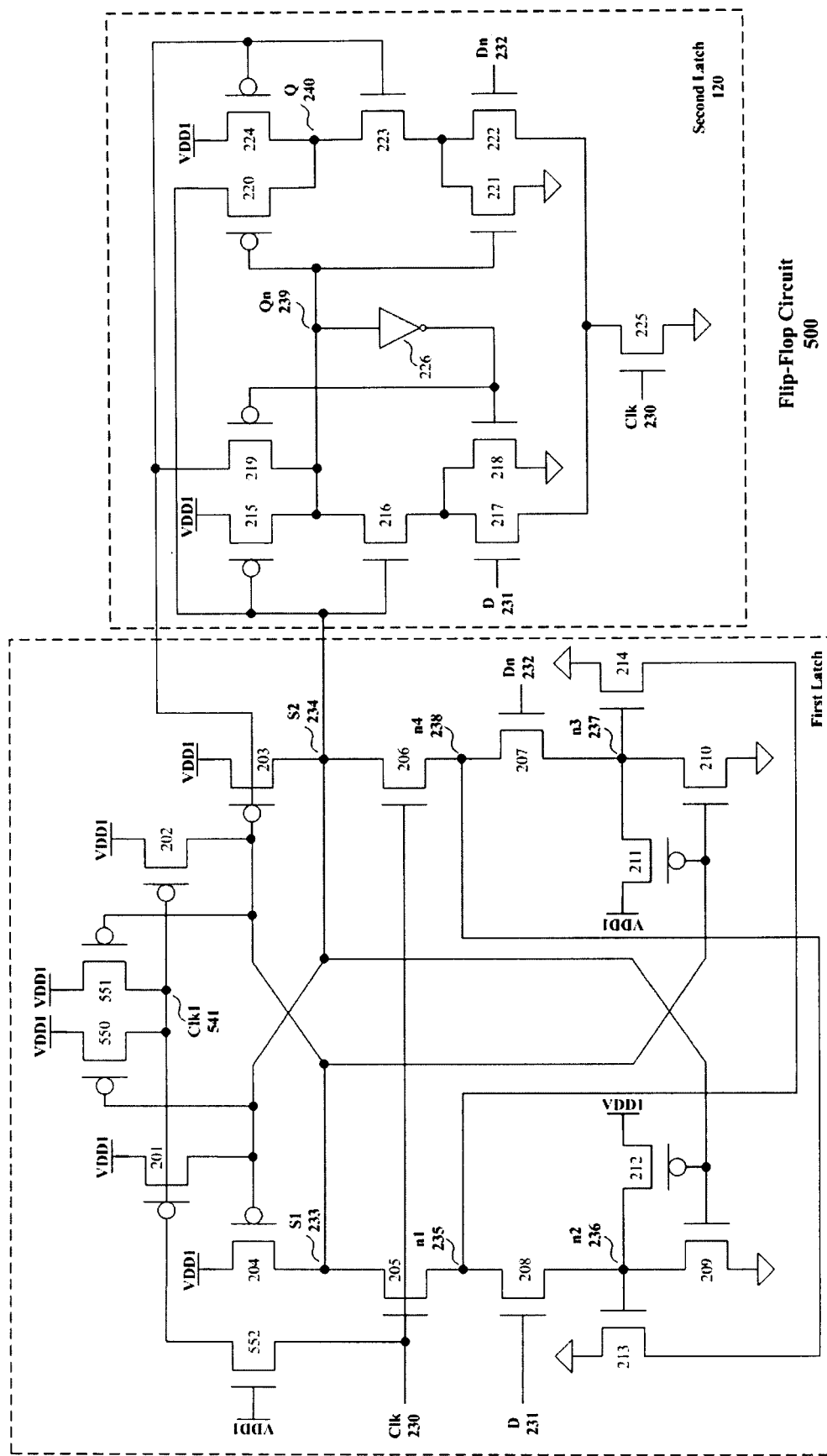
FIG. 5 is a flip-flop circuit diagram supporting clock signal originating from same voltage domain as main input signal according to some embodiments of the disclosure.

Clock signal Clk 230 in the embodiments of FIGS. 2-4 are part of the first voltage domain VDD1 of the flip-flop. In some configurations, clock signal Clk 230 may originate from the same second voltage domain VDD2 as the main input signal D 231 and inverted main input signal Dn 232, whereby clock signal Clk 230 may transition between first level and third level. Accordingly, a flip-flop receiving the input and clock signals from a different voltage domain can include a level restorer sub-circuit without need for additional level shifting circuitry. FIG. 5 illustrates a flip-flop circuit 500 with such level restorer sub-circuit in the first latch 110. The level restorer sub-circuit converts the third level clock signal to a suitable second level compatible for the precharge transistors of the flip-flop, so that an equivalent clock signal at the gate terminals of the precharge transistors toggles between first and second level. Otherwise, a clock signal that toggles between first and third level may not fully deactivate the precharge transistors during the evaluate phase (clock is high) of the clock and can result in additional static power dissipation. The level restorer sub-circuit comprising of transistors 550, 551, and 552 is coupled to the precharge transistors 201 and 202. The gate terminal of transistor 552 is coupled to first domain high-power supply VDD1. The source terminal of transistor 552 is coupled to the clock signal Clk 230 from same voltage domain as main input signal D 231, and the drain terminal is coupled to the gate terminals of precharge transistors 201 and 202 at node Clk1 541. The source terminals of transistors 550 and 551 are coupled to first domain high-power supply VDD1, and the drain terminals are coupled to node Clk1 541. The gate terminal of transistor 550 may be coupled to first output node S1 233 or to second output node S2 234. Likewise, the gate terminal of transistor 551 may be coupled to second output node S2 234 or to first output node S1 233. Both gate terminals of transistors 550 and 551 cannot be coupled to the same node. In this manner, the level restorer sub-circuit is coupled also to the first and second output nodes of the first latch 110. The operation of the level restorer sub-circuit is discussed briefly. When clock signal Clk 230 is at first level, transistor 552 conducts a voltage signal to node Clk1 541 equivalent to first level. When clock signal Clk 230 is at third level, transistor 552 may conduct a voltage signal to node Clk1 541 different than the second level suitable for the precharge transistors. When either first output node S1 233 or second output node S2 234 discharges to first level, transistor 550 or 551 is activated to charge node Clk1 541 to second level (VDD1). Transistor 550 or 551 essentially "restores" an attenuated voltage signal at node Clk1 541 to a full second level during the evaluate phase of clock and hence, fully deactivates the precharge transistors to avoid static power consumption. It should be noted that the implementation of this level restorer sub-circuit can be applied to the embodiments of FIGS. 3 and 4.

Figure 6:
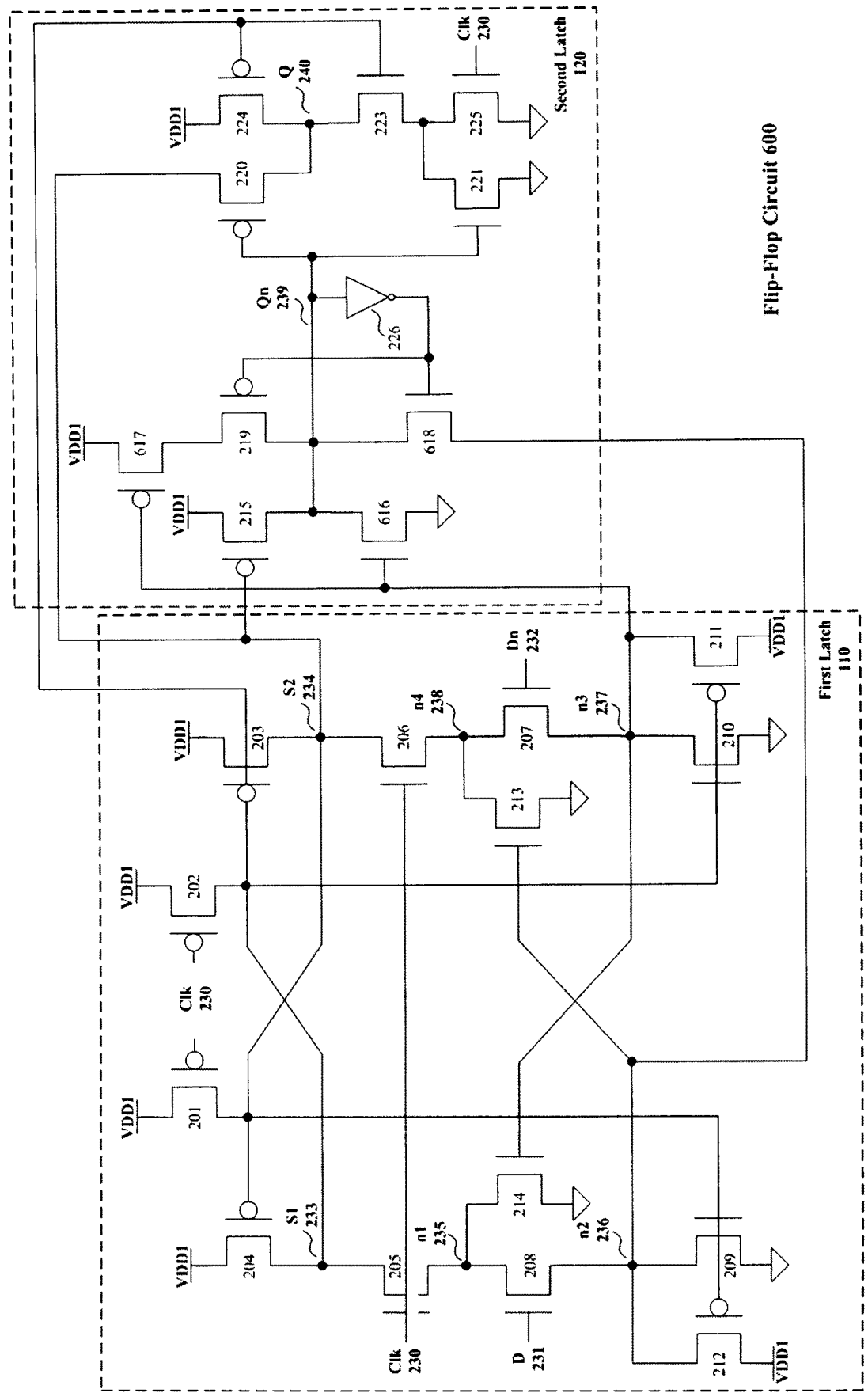
FIG. 6 is a flip-flop circuit diagram with one clock element in the second latch stage according to some embodiments of the disclosure.

Those skilled in the art can realize that embedded logic can be incorporated into the input stage of the first latch 110 for greater integration and silicon density. Multi-input N-logic tree can be inserted at the position of transistor 208, and the complementary logic tree can be inserted at the position of transistor 207. As an example, AND/OR/XOR/AOI logic can be inserted into the input stage of first latch 110. FIG. 2 illustrates an input stage present in both the first and second latches and the integration benefits of embedding logic into the flip-flop circuit can be diminished. To this end, it is desirable to remove the input-gated dependency from the second latch. FIG. 6 illustrates an embodiment which removes this dependency from the second latch 120. The second pull-down network remains driven by the first output node S1 233 of first latch 110. The second intermediate node n3 237 from the first latch 110 is also the output of the second inverter sub-circuit comprising transistors 210 and 211. The gate terminal of transistor 616 is driven by the output of the second inverter sub-circuit and the source terminal is coupled to low-power supply. Consequently, the first pull-down network comprises only transistor 616 in the configuration of FIG. 6. Furthermore, the first keeper pull-down sub-circuit comprises transistor 618, whose source terminal is coupled to the first intermediate node n2 236, which is also known as the output of the first inverter sub-circuit. Additionally, the first keeper pull-up sub-circuit comprises transistors 219 and 617. The gate terminal of transistor 617 is coupled to the second intermediate node n3 237 and the first keeper pull-up sub-circuit is driven by the output of the second inverter sub-circuit. It should be noted that the first keeper pull-up sub-circuit is decoupled from the output nodes of the first latch 110 and does not require clock gating to eliminate contention between the first pull-down network and the first keeper pull-up sub-circuit. In some configurations, transistor 617 may be omitted and the source terminal of transistor 219 is coupled to the first output node S1 233 of the first latch 110, as shown in previous embodiments.

The operation of flip-flop circuit 600 is similar to flip-flop circuit 300; however, the functionality of the first pull-down network and first keeper pull-up sub-circuit differs. The first pull-down network is activated upon the discharging of the first output node S1 233 of the first latch 110 as the output of second inverter sub-circuit transitions to second level. When the first pull-down network is activated, the first keeper pull-up sub-circuit is deactivated as transistor 617 turns off. As clock signal Clk 230 enters the precharge phase, transistor 617 is activated. It can be observed that the first keeper pull-up sub-circuit has an inverse activation relationship with the first pull-down network. Furthermore, the operation of first keeper pull-down sub-circuit (transistor 618) is similar to transistor 418 described in FIG. 4.

Flip-flop circuit 600 combines the strengths of flip-flop circuits 200 and 300. The first pull-down network is decoupled from the second pull-down network in a manner similar to flip-flop circuit 300. Only one clock-activated transistor 225 may be utilized in the second pull-down network. The configuration of the first pull-down network eliminates or reduces a voltage drop at storage node Qn 239 when input signal D 231 is at first level across many clock cycles. The pull-down output drive at Q 240 is determined by two transistors in the same manner as flip-flop circuit 300. Consequently, flip-flop circuit 600 has a NAND2 equivalent output drive capability.

Figure 7:
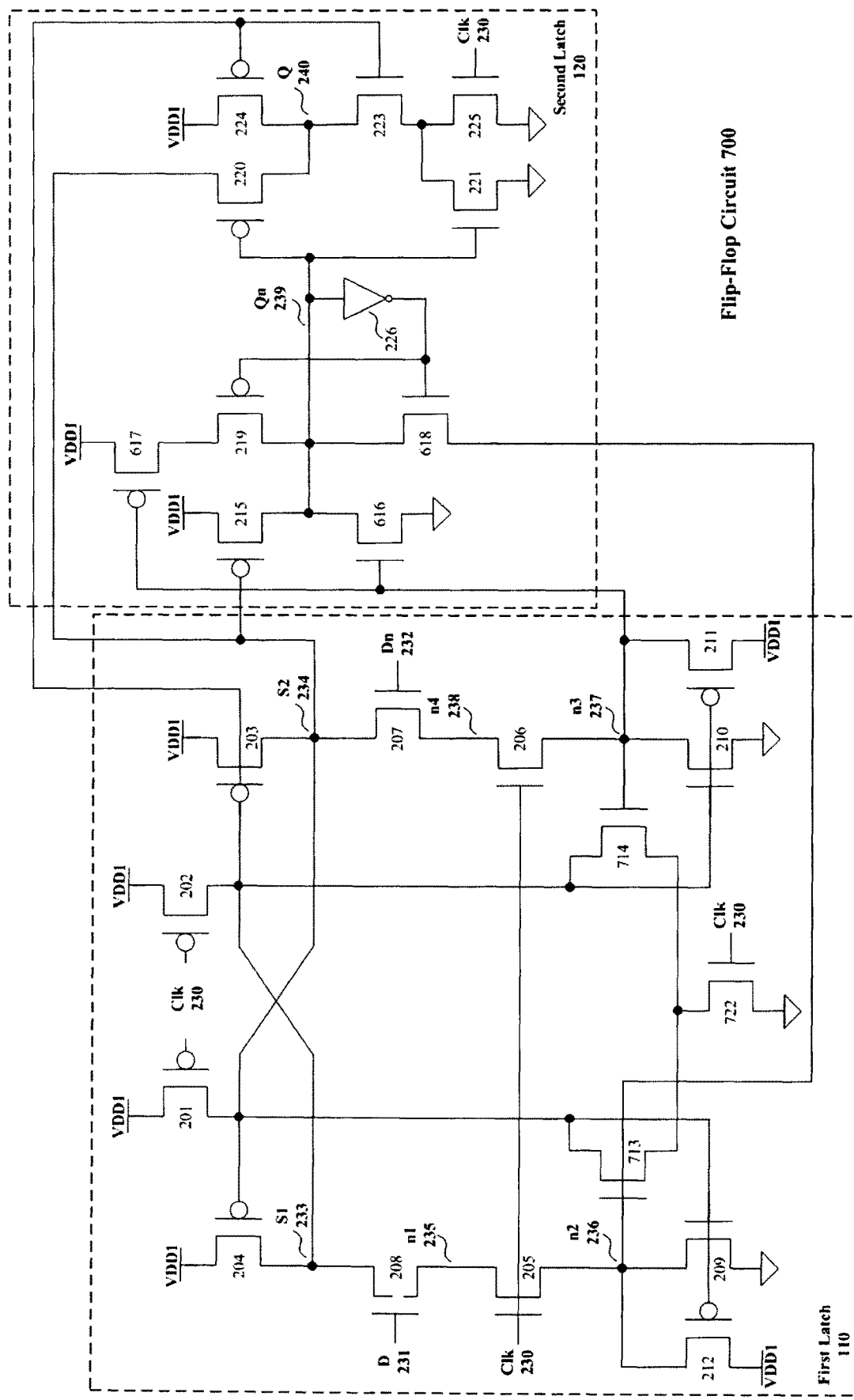
FIG. 7 is a flip-flop circuit diagram with different clock-main input ordering in the first latch stage according to some embodiments of the disclosure.

FIG. 7 illustrates an embodiment which has a different input and clock signal ordering in the first latch 110. In some configurations, it may be desirable to have the input stage coupled to the output nodes of the first latch 110. As such, the drain terminal of first keeper transistor 714 is coupled to the first output node S1 233 and the drain terminal of second keeper transistor 713 is coupled to the second output node S2 234. Both source terminals of transistors 713 and 714 are coupled to clock-activated transistor 722, which is a clock-gating device for the first and second keeper transistors. In this manner, the first and second keeper transistors do not contend with precharge transistors 202 and 201 during the precharge phase of clock.

Figure 8:
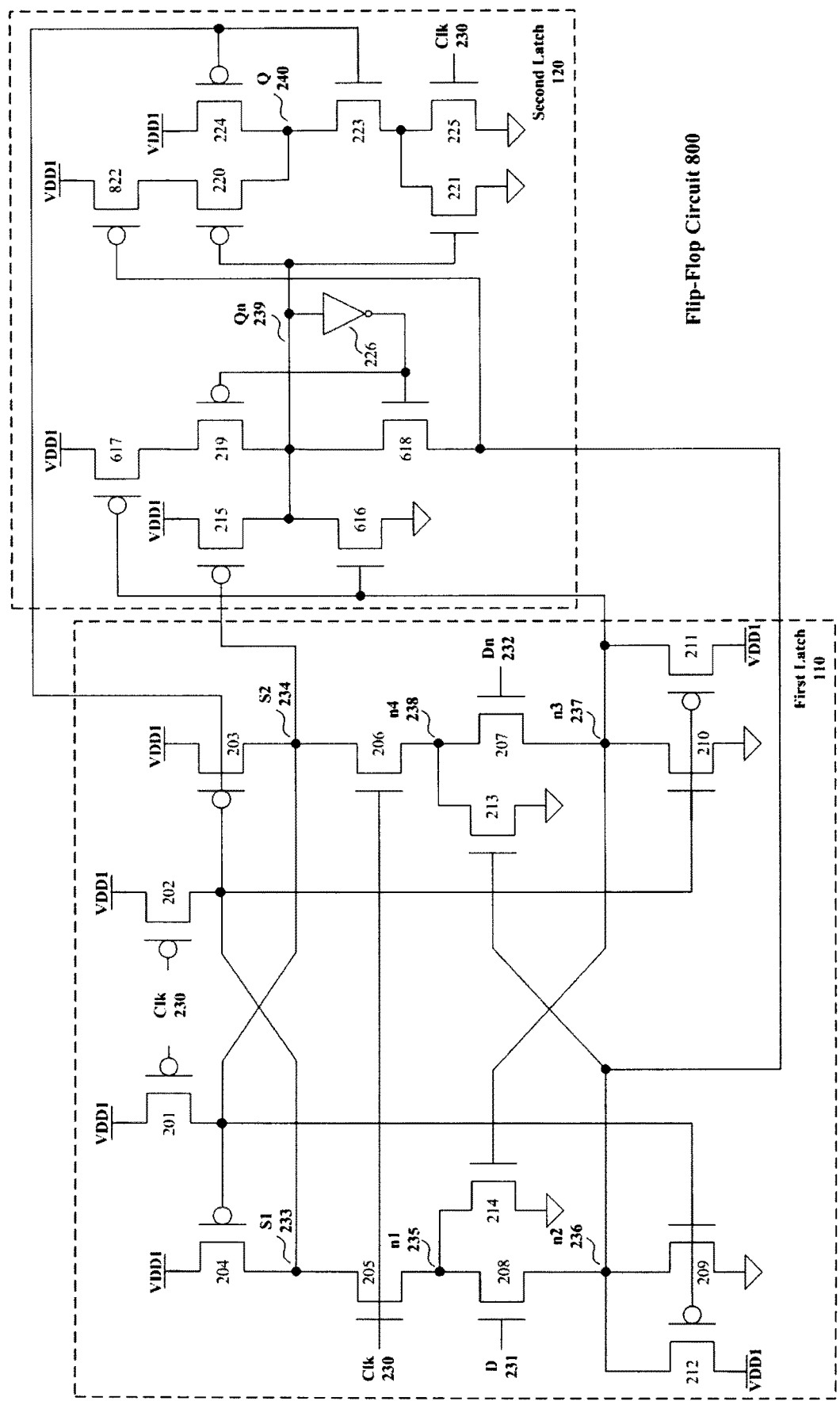
FIG. 8 is a flip-flop circuit with one clock element in the second latch stage without merged functionality according to some embodiments of the disclosure.

FIG. 8 illustrates an embodiment in which the second keeper pull-up sub-circuit is decoupled from the output nodes of the first latch 110. Both first and second keeper pull-up sub-circuits of second latch 120 do not merge the pull-up functionality with the first and second clock-activated transistors of the first latch 110. Transistor 220 is in series with transistor 822 to constitute the second keeper pull-up sub-circuit. The gate terminal of transistor 822 is driven by the output of the first inverter sub-circuit while the second pull-down network is driven by the first output node S1 233 of first latch 110 (gate terminal of transistor 223 is coupled to S1 233). Similar to the first keeper pull-up sub-circuit, the second keeper pull-up sub-circuit does not require clock-gating to eliminate contention between the second keeper pull-up sub-circuit and the second pull-down network.

A flip-flop is a memory element designed to sample a data bit during clock signal at first level, generate an output based on the level of the captured data bit at the rising edge of a clock signal, and retain the state of that data bit. Conventional flip-flops require a setup time for the data bit at the input signal to be stable prior to the rising edge of the clock signal or else the generated output signal does not reflect the captured data bit. The invention disclosure presents seven embodiments of FIGS. 2-8 which have a configuration at the input stage that allows the arrival of the data edge simultaneously with the clock edge. The series stack configuration of the input stage permits both transistors 205 and 208 to be activated simultaneously to discharge first output node S1 233. Thus, less or no setup time is required by the seven embodiments of FIGS. 2-8. Consequently, the contemplated flip-flop circuits offer a promising solution to address setup time violations in a conventional ASIC design flow as the input signal can transition before or at the rising edge of the clock signal.

High-performance, low-power digital systems like microprocessors often are designed using fully static circuits for better noise immunity and greater robustness. Furthermore, fully static designs are better suited for low-power applications which do not consume energy every clock cycle like dynamic circuits. To realize a fully static circuit, keeper sub-circuits are generally implemented to avoid dynamic state nodes. These keeper sub-circuits in turn employ various clock-gating techniques for contention-free operation to avoid drive fights between pull-up and pull-down networks. Clock-gating, however, often can be costly from power consumption perspective as it requires clock-activated transistors in the pull-up or pull-down networks of the keeper sub-circuits. These clock-activated transistors pose a tremendous burden on the clock signal and associated clock tree which can comprise up to 50% of the total system power consumption. In prior arts, the first and second keeper pull-up networks usually include separate and discrete clock-activated transistors in the pull-up stack. For example, the source terminal of transistor 219 can be coupled to the drain terminal of a discrete transistor, whose gate terminal is coupled to a clock signal and source terminal coupled to high-power supply. The embodiments of FIGS. 2-5 eliminate or reduce the need for this discrete transistor by realizing that the precharge transistors can serve the same functionality. The source terminals of transistors 219 and 220 are coupled to the drain terminals of precharge transistors 202 and 201, respectively. Consequently, merging the pull-up functionality of the first and second keeper pull-up sub-circuits with the precharge transistors results in a flip-flop circuit with reduced element count and less burden on the clock network resulting in overall lower power consumption.

What is claimed is:

1. A flip-flop circuit, comprising:
a first latch operating in a first voltage domain, wherein the first latch comprises:
four clock-activated transistors comprising at least a first clock-activated transistor and a second clock-activated transistor;
a first output node; and
a second output node;
a second latch operating in the first voltage domain, wherein the second latch comprises:
a first keeper pull-up sub-circuit coupled to the first output node,
wherein the first keeper pull-up sub-circuit is electrically coupled to the first-clock-activated transistor of the first latch and the first clock-activated transistor is a clock-gated device for the first keeper pull-up sub-circuit;
a second keeper pull-up sub-circuit coupled to the second output node,
wherein the second keeper pull-up sub-circuit is electrically coupled to the second clock-activated transistor of the first latch and the second clock-activated transistor is a clock-gated device for the second keeper pull-up sub-circuit;
a first pull-down network; and
a second pull-down network,
wherein the second latch is configured to merge pull-up functionality of the first keeper pull-up sub-circuit with the first clock-activated transistor of the first latch and to merge pull-up functionality of the second keeper pull-up sub-circuit with the second clock-activated transistor of the first latch.

2. The flip-flop circuit of claim 1, wherein the first pull-down network of the second latch receives a first input from the second output node and the second pull-down network of the second latch receives a second input from the first output node.

3. The flip-flop circuit of claim 1, wherein the four clock-activated transistors further comprise a third clock-activated transistor and a fourth clock activated transistor, wherein the first clock-activated transistor and the third clock-activated transistor of the first latch are electrically coupled to the first output node and the second clock-activated transistor and the fourth clock-activated transistor of the first latch are electrically coupled to the second output node.

4. The flip-flop circuit of claim 3, wherein the first latch further comprises a first p-type transistor electrically coupled to a first intermediate node of the first latch to form a first inverter sub-circuit and the first intermediate node is an output of the first inverter sub-circuit, wherein the first latch further comprises a second p-type transistor electrically coupled to a second intermediate node of the first latch to form a second inverter sub-circuit and the second intermediate node is an output of the second inverter sub-circuit.

5. The flip-flop circuit of claim 1, wherein the first pull-down network is electrically coupled to the second pull-down network and the first pull-down network and the second pull-down network are electrically coupled to a first clock-activated transistor of the second latch.

6. The flip-flop circuit of claim 1, wherein the first pull-down network receives an input signal from a second voltage domain independent from the first voltage domain and the second pull-down network receives an inverted input signal from the second voltage domain.

7. The flip-flop circuit of claim 1, wherein the first pull-down network comprises a second clock-activated transistor of the second latch and the second pull-down network comprises a third clock-activated transistor of the second latch, wherein the first pull-down network is electrically decoupled from the second pull-down network.

8. The flip-flop circuit of claim 1, wherein the second latch further comprises a first keeper pull-down sub-circuit electrically coupled to the first pull-down network, wherein the first keeper pull-down sub-circuit and the first pull-down network are electrically coupled to a first intermediate node of the first latch.

9. The flip-flop circuit of claim 6, wherein the flip-flop circuit is configured to sample a data bit when an input signal from the second voltage domain transitions before or at a rising edge of a clock that activates the at least four clock-activated transistors.

10. The flip-flop circuit of claim 8, wherein the first keeper pull-down sub-circuit and the first pull-down network are electrically coupled to a second keeper transistor of the first latch, wherein the second keeper transistor is enabled by the first pull-down network.

11. The flip-flop circuit of claim 8, wherein the second pull-down network is electrically coupled to a second intermediate node of the first latch.

12. The flip-flop circuit of claim 8, wherein the second pull-down network is electrically coupled further to a first keeper transistor of the first latch, wherein the first keeper transistor is enabled by the second pull-down network.

13. The flip-flop circuit of claim 1, wherein the first latch further comprises a level restoring sub-circuit electrically coupled to the first clock-activated transistor and the second clock-activated transistor and coupled to the first output node and the second output node of the first latch.

14. The flip-flop circuit of claim 1, wherein the propagation delay of the flip-flop circuit is one or two stage delays.

15. A flip-flop circuit, comprising:
a first latch operating in a first voltage domain, wherein the first latch comprises:
four clock-activated transistors,
a first output node,
a second output node,
a first intermediate node,
a second intermediate node,
a first p-type transistor electrically coupled to the first intermediate node to form a first inverter sub-circuit, and
a second p-type transistor electrically coupled to the second intermediate node to form a second inverter sub-circuit;
a second latch operating in the first voltage domain, wherein the second latch comprises:
a first keeper pull-up sub-circuit coupled to the second intermediate node;
a second keeper pull-up sub-circuit;
a first keeper pull-down sub-circuit coupled to the first intermediate node;
a first pull-down network; and
a second pull-down network,
wherein the first intermediate node is an output of the first inverter sub-circuit and the second intermediate node is an output of the second inverter sub-circuit.

16. The flip-flop circuit of claim 15, wherein the first keeper pull-up sub-circuit is coupled to the output of the second inverter sub-circuit, wherein the first pull-down network is driven by the output of the second inverter sub-circuit and the first pull-down network is activated upon the discharging of the first output node of the first latch.

17. The flip-flop circuit of claim 15, wherein when the first pull-down network is activated, the first keeper pull-up sub-circuit is deactivated.

18. The flip-flop circuit of claim 15, wherein the second keeper pull-up sub-circuit is coupled to the second output node of the first latch.

19. The flip-flop circuit of claim 15, wherein the second keeper pull-up sub-circuit is coupled to the output of the first inverter sub-circuit and the second pull-down network receives an input from the first output node of the first latch.

* * * * *